United States Patent
Ogihara et al.

(10) Patent No.: US 7,713,398 B2
(45) Date of Patent: May 11, 2010

(54) SELECTIVE PLATING APPARATUS AND SELECTIVE PLATING METHOD

(75) Inventors: Yoko Ogihara, Nagano (JP); Takeshi Takano, Nagano (JP); Kazuo Nakabayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 1023 days.

(21) Appl. No.: 11/419,904

(22) Filed: May 23, 2006

(65) Prior Publication Data

US 2006/0283713 A1 Dec. 21, 2006

(30) Foreign Application Priority Data

May 24, 2005 (JP) .............................. 2005-150625

(51) Int. Cl.
*C25D 5/08* (2006.01)
(52) U.S. Cl. .................... 205/133; 205/118; 204/224 R
(58) Field of Classification Search ................. 205/118, 205/125, 129, 133; 204/202, 206, 224 R
See application file for complete search history.

(56) References Cited

U.S. PATENT DOCUMENTS 4,376,683 A * 3/1983 Hellwig et al. .............. 205/133

FOREIGN PATENT DOCUMENTS

| JP | 58-174589 | 10/1983 |
| JP | 58174589 A * | 10/1983 |

* cited by examiner

*Primary Examiner*—Nam X Nguyen
*Assistant Examiner*—Luan V Van
(74) *Attorney, Agent, or Firm*—Rankin, Hill & Clark LLP

(57) ABSTRACT

A selective plating apparatus for applying selective electrolytic plating to a metal member includes: a mask member having a recess portion so that a space is formed to which predetermined parts of a surface of the metal member are exposed when the mask member is attached to the metal member, and having at least one supply opening for supplying electrolytic plating solution into the space and a discharge opening for discharging the electrolytic plating solution from the space both formed in a bottom portion of the recess portion; and at least one injection nozzle which injects the electrolytic plating solution in an oblique direction with respect to the predetermined parts of the surface of the metal member, and is arranged in vicinity of the supply opening.

10 Claims, 5 Drawing Sheets

SELECTIVE PLATING APPARATUS AND SELECTIVE PLATING METHOD

This application claims foreign priority based on Japanese Patent application No. 2005-150625, filed May 24, 2005, the content of which is incorporated herein by reference in its entirety.

BACKGROUND OF THE INVENTION

1. Field of the Invention

The present invention relates to a selective plating apparatus and a selective plating method, and more particularly, a selective plating apparatus for applying an electrolytic plating to a metal member onto which a mask member is attached so as to expose predetermined parts of a surface of the metal member, and so as to cover the predetermined parts of the surface with a plated metal layer made of a desired metal, and a selective plating method using this selective plating apparatus.

2. Description of the Related Art

In a lead frame used in a semiconductor device as shown in FIG. 8, a plurality of leads 10a are formed on a belt-shaped metal member 11 so as to surround a stage 10 on which a semiconductor element is mounted.

In the lead frame shown in FIG. 8, respective electrode terminals of the semiconductor element mounted on the stage 10 and corresponding tip end portions of the leads 10a on the stage 10 side (sometimes referred simply to as "tip end portions of the leads 10a" hereinafter) are bonded via wire and connected electrically. In order to make sure of the electrical connection, normally selective electrolytic plating such as electrolytic silver plating is applied to a shaded portion shown in FIG. 8, i.e., a whole surface of the stage 10 and the tip end portions of the respective leads 10a.

In JP-A-58-174589 (FIG. 3), for example, it has been proposed that the selective plating apparatus shown in FIG. 9 should be employed in such selective electrolytic plating.

In the selective plating apparatus shown in FIG. 9, the lead frame is put between a pressing plate 100 and a mask member 102. An overall surface of the stage 10 of the lead frame and the leads 10a are exposed to a space 110 formed when the mask member 102 is attached onto the lead frame.

In such mask member 102, a mask plate 102b in which a supply opening 104 and discharge openings 106 for the electrolysis solution are formed is sandwiched between mask plate holding members 102a, 102c, and thus a recess portion 108 is formed by the mask plate holding member 102a and the mask plate 102b. This recess portion 108 constitutes the space 110 when the lead frame is held between the pressing plate 100 and the mask member 102.

Also, an injection nozzle 112 for injecting electrolytic plating solution is provided immediately under the supply opening 104 which is formed in the mask plate 102b, at a right angle to the mask plate 102b.

In addition, a mesh-like anode 114 connected to an anode of a DC power supply is held between the mask plate 102b and the mask plate holding member 102c.

In this case, the lead frame is connected to a cathode of the DC power supply.

According to the selective plating apparatus shown in FIG. 9, the electrolytic plating solution injected from the injection nozzle 112 is passed through the mesh-like anode 114, then enters into the space 110 toward a center portion of the stage 10 of the lead frame from the supply opening 104 in the mask plate 102b. Then, the electrolytic plating solution moves toward the discharge openings 106 while depositing a plated metal on the overall surface of the stage 10 of the exposed lead frame and surfaces of the respective tip end portions of the leads 10a, and is discharged from the discharge openings 106.

However, according to the selective plating apparatus shown in FIG. 9, the plated metal layer that is thicker than the plated metal layers on the tip end portions of the leads 10a is formed on the stage 10, as set forth in JP-A-58-174589, page 2, left lower column, lines 9 to 12.

In this manner, according to the selective plating apparatus shown in FIG. 9, there is unevenness in thickness between the plated metal layer formed on the stage 10 and the plated metal layers formed on respective tip end portions of the leads 10a.

As a consequence, the selective plating apparatus shown in FIG. 9 cannot be applied to the selective plating of which a uniform thickness of the plated metal layers formed on the stage 10 and respective tip end portions of the leads 10a is required.

Also, in some cases the electrolytic plating should be applied to a shaded portion of the lead frame shown in FIG. 10, i.e., only the peripheral portion of the stage 10 and the tip end portions of the leads 10a on the stage 10 side.

In this case, as shown in FIG. 11, a column portion 120 whose top end face comes in touch with a surface of the stage 10 is formed on the mask member 102 such that the plated metal is not deposited on the surface of the stage 10 other than its peripheral surface. When the lead frame is sandwiched between such mask member 102 and the pressing plate 100, an annular space 110 surrounding the column portion 120 is formed by the recess portion 108 formed in the mask member 102.

The electrolytic plating solution injected from the injection nozzle 112, which is provided at a right angle to the lead frame, is supplied into the annular space 110 shown in FIG. 11 from the supply opening 104. The electrolytic plating solution supplied into the space 110 is discharged from the discharge openings 106 while depositing the plated metal on the surface of the peripheral portion of the stage and the surfaces of the tip end portions of respective leads 10a on the stage 10 side.

However, it is found that, according to the selective plating apparatus shown in FIG. 11, unevenness in thickness between the plated metal layer formed on the stage 10 and the plated metal layers formed on respective tip end portions of the leads 10a is further increased.

SUMMARY OF THE INVENTION

The present invention has been made in view of the above circumstances, and provides a selective plating apparatus and a selective plating method, capable of forming plated metal layers in selective plating areas which are formed on a metal member, so as to obtain a thickness as uniform as possible.

In order to overcome the above problem, the inventors of the present invention first considered that the selective plating apparatus shown in FIG. 11 causes stagnation of the electrolytic plating solution in the space 110. Thus, as shown in FIG. 12, a plurality of supply openings 104 and discharge openings 106 are formed in the mask member 102, and also the injection nozzles 112 are provided in close vicinity of respective supply openings 104.

The injection nozzles 112 are provided upright on one surface side of a nozzle plate 116. An anode plate 118 is disposed on one surface side of the nozzle plate 116.

According to the selective plating apparatus shown in FIG. 12, unevenness in thickness between the plated metal layer formed on the stage 10 and the plated metal layers formed on respective tip end portions of the leads 10a can be reduced in contrast to the selective plating apparatus shown in FIG. 11.

However, it is expected that unevenness in thickness between the plated metal layer formed on the stage 10 and the plated metal layers formed on respective tip end portions of the leads 10a is further reduced.

Therefore, the inventors of the present invention have studied how unevenness in thickness is caused between the plated metal layer formed on the stage 10 and the plated metal layers formed on respective tip end portions of the leads 10a. Then, the inventors of the present invention have found the fact that, in the selective plating apparatus shown in FIG. 11 and FIG. 12, a flow speed of the electrolytic plating solution to the lead frame in the space 110 is important and also it is effective to generate a swirling flow of the electrolytic plating solution in the space 110, and have come to the present invention.

In some implementations, a selective plating apparatus of the invention for applying selective electrolytic plating to a metal member comprises:

a mask member having a recess portion so that a space is formed to which predetermined parts of a surface of the metal member are exposed when the mask member is attached to the metal member, and having at least one supply opening for supplying electrolytic plating solution into the space and a discharge opening for discharging the electrolytic plating solution from the space, the supply opening and the discharge opening both formed in a bottom portion of the recess portion; and at least one injection nozzle which injects the electrolytic plating solution in an oblique direction with respect to the predetermined parts of the surface of the metal member, and is arranged in vicinity of the supply opening.

Also, the present invention provides a selective plating method of applying selective plating to a metal member by using the selective plating apparatus.

In such present invention, preferably the injection nozzle is provided to be tilted with respect to the surface of the metal member.

Also, preferably the metal member is a lead frame. Especially, the metal member is a lead frame on which a periphery portion of a stage for mounting a semiconductor element is surrounded by a plurality of tip end portions of leads, and the mask member covers the surface of the lead frame except a surface of the peripheral portion of the stage and surfaces of the tip end portions of the leads.

In addition, the at least one supply opening includes a plurality of supply openings, and the at least one injection nozzle includes a plurality of injection nozzles respectively corresponding to the supply openings. Therefore, a thickness of the plated metal layer in the area of the metal member to which the selective plating is applied can be formed as uniform as possible.

According to the selective plating apparatus of the present invention, the supply opening for supplying the electrolytic plating solution into the space to which the predetermined parts of the surfaces on which the selective plating of the metal member is applied is exposed, and the discharge opening for discharging the electrolytic plating solution from the space are formed, and the injection nozzle for injecting the electrolytic plating solution in an oblique direction to the predetermined parts of the surface of the metal member, which are exposed to the space, is arranged in vicinity of the supply opening.

According to such selective plating apparatus of the present invention, the electrolytic plating solution fed from the injection nozzle is injected into the space to be sprayed in the oblique direction to the predetermined parts of the surface of the metal member via the supply opening, and then the electrolytic plating solution is discharged from the space to the outside of the space via the discharge opening.

In this manner, a swirling flow of the electrolytic plating solution is generated in the space by the electrolytic plating solution injected into the space in the oblique direction to hit against the predetermined parts on the surface of the metal member. Thus, stagnation in the space can be eliminated and a flow rate of the electrolytic plating solution with respect to the predetermined parts of the surface of the metal member can be enhanced.

As a result, unevenness in thickness of the plated metal layer formed on the predetermined parts of the surface of the metal member, which is caused due to the stagnation generated in the electrolytic plating solution in the space, can be reduced as much as possible, and also a thickness of the plated metal layer on the predetermined parts of the surface of the metal member can be formed as uniform as possible.

DESCRIPTION OF THE PREFERRED EMBODIMENTS

Figure 1:
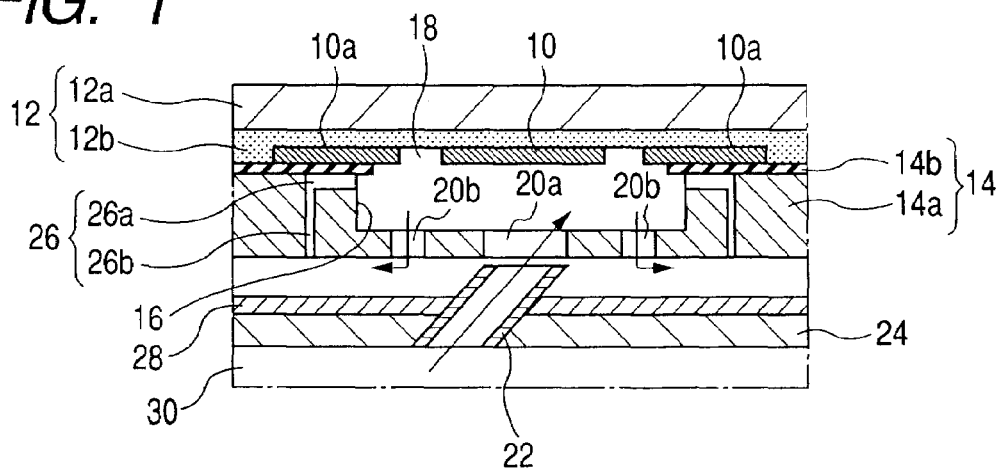
FIG. 1 is a partial sectional view explaining an example of a selective plating apparatus according to an embodiment of the invention.

A selective plating apparatus according an embodiment of the present invention is shown in FIG. 1. FIG. 1 is a partial sectional view of the selective plating apparatus using a lead frame as a metal member. The selective plating is applied to this lead frame to form the plated metal layer on an overall surface of a stage 10 and tip end portions of leads 10a on the stage 10 side.

The lead frame is sandwiched between a plate-like member 12 and a mask member 14. The plate-like member 12 includes a pressing hardware 12a and a pressing rubber 12b. The mask member 14 includes a mask plate 14a and a rubber plate 14b.

A recess portion 16 is formed in such mask plate 14a, and a space 18 is formed when the lead frame is held between the plate-like member 12 and the mask member 14. A whole surface of the stage 10 of the lead frame and the tip end portions of respective leads 10a on the stage 10 side, to which the selective plating is applied, are exposed to this space 18. The portion of the lead frame not exposed to the space 18 is brought into tight contact with the pressing rubber 12b and the rubber plate 14b and is held by them.

In addition, a supply opening 20a and discharge openings 20b are formed in a bottom portion of the recess portion 16 of the mask plate 14a. The supply opening 20a supplies the electrolytic plating solution into the space 18. The discharge openings 20b discharge the electrolytic plating solution from the space 18.

An injection nozzle 22 for injecting the electrolytic plating solution contained in a liquid cell 30 into the space 18 is provided in vicinity of the supply opening 20a of the electrolytic plating solution on the inlet side to project. The injection nozzle 22 is provided to be tilted with respect to a nozzle plate 24. This tilted injection nozzle 22 (sometimes referred to as the "tilted injection nozzle 22" hereinafter) is provided to have a tilt angle that makes it possible to inject the electrolytic plating solution in the oblique direction to the exposed parts of the surface of the lead frame (the overall surface of the stage 10 and the tip end portions of respective leads 10a on the stage 10 side) that are exposed in the space 18, via the supply opening 20a. A tilt angle of about 45° is preferable.

Also, an anode plate 28 connected to an anode of a power supply (not shown) is attached onto a surface of the nozzle plate 24 on the mask plate 14a side. A cathode of the power supply is connected to the lead frame.

In addition, air vent holes 26 for releasing air in the space 18 are formed in the mask plate 14a. This air vent hole 26 includes a notched portion 26a formed in vicinity of a boundary between the mask plate 14a and the rubber plate 14b, and a fine hole 26b one end of which is connected to the notched portion 26a and the other end of which is opened to a surface of the mask plate 14a on the injection nozzle 22 side.

In the selective plating apparatus shown in FIG. 1, when the anode plate 28 is connected to the anode of the power supply and also the lead frame is connected to the cathode of the power supply and then the electrolytic plating solution is injected into the space 18 from the tilted injection nozzle 22 via the supply opening 20a in the mask plate 14a, a plated metal layer is formed on the exposed parts of the surface of the lead frame (the overall surface of the stage 10 and the tip end portions of respective leads 10a on the stage 10 side) exposed in the space 18, while discharging air in the space 18 to the outside of the space 18 via the air vent holes 26.

At that time, the electrolytic plating solution in the space 18 is discharged from the discharge openings 20b and returned to the liquid cell 30 while the electrolytic plating solution is being injected in the oblique direction to the overall surface of the stage 10 and the tip end portions of respective leads 10a on the stage 10 side exposed in the space 18 from the tilted injection nozzle 22 via the supply opening 20a.

In this manner, since the electrolytic plating solution is injected into the space 18 in the oblique direction to the exposed parts of the surface of the lead frame, a swirling flow of the electrolytic plating solution is generated in the space 18. Accordingly, a stagnation part in which the electrolytic plating solution stagnates in the space 18 with respect to the exposed parts of the surface of the lead frame can be eliminated, and also a flow rate of the electrolytic plating solution with respect to the exposed parts of the surface of the lead frame can be enhanced. As a result, unevenness in thickness of the plated metal layer formed on the exposed parts of the surface of the lead frame, which is caused due to stagnation of the electrolytic plating solution, can be reduced as much as possible.

Figure 9:
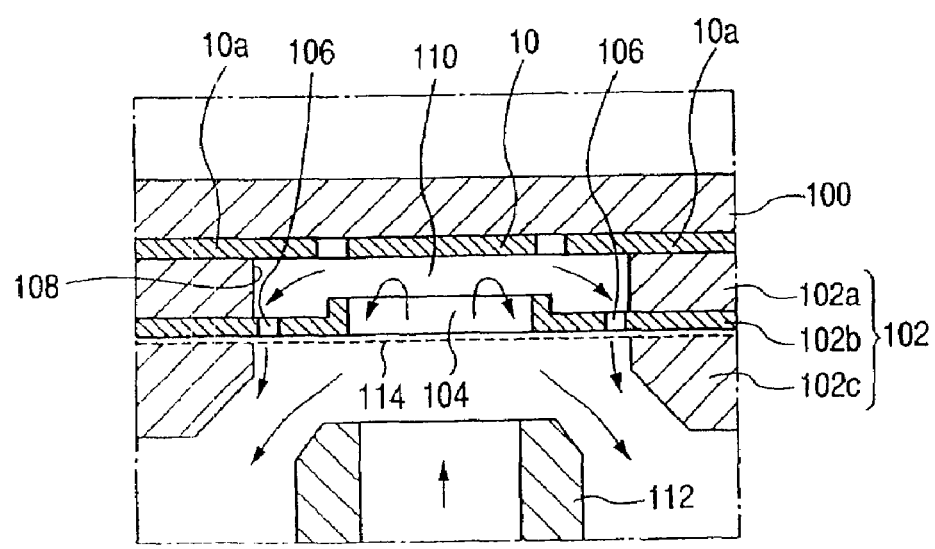
FIG. 9 is a partial sectional view explaining the selective plating apparatus in the related art.
Figure 11:
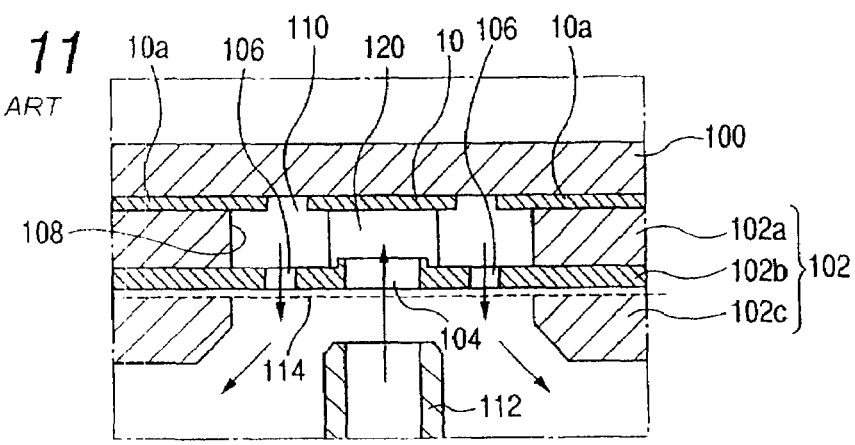
FIG. 11 is a partial sectional view explaining a selective plating apparatus of the related art.
Figure 12:
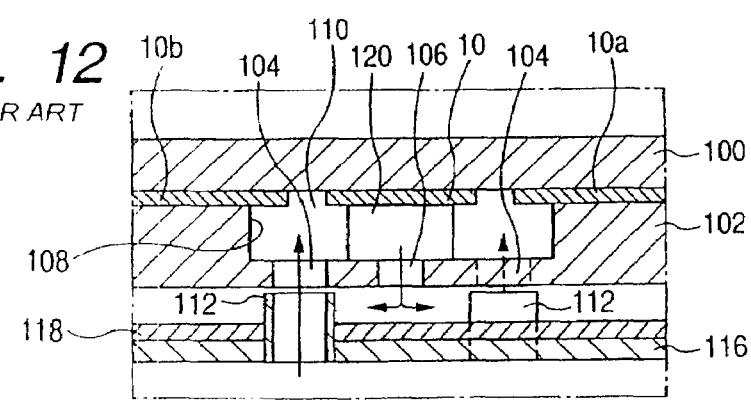
FIG. 12 is a partial sectional view explaining the improved selective plating apparatus obtained by improving the selective plating apparatus shown in FIG. 11.

On the contrary, in the selective plating apparatus shown in FIG. 9, FIG. 11 and FIG. 12 in the related arts, since the injection nozzle 112 injects the electrolytic plating solution at a right angle to the exposed parts of the surface of the lead frame, the electrolytic plating solution injected from the injection nozzle 112 hits the exposed parts of the surface of the lead frame and bounces back in the reverse direction. At that time, an area in which a flow rate of the electrolytic plating solution becomes zero (stagnation part) is formed. Therefore, unevenness in thickness of the plated metal layer formed on the exposed parts of the surface of the lead frame is likely to occur.

Figure 2:
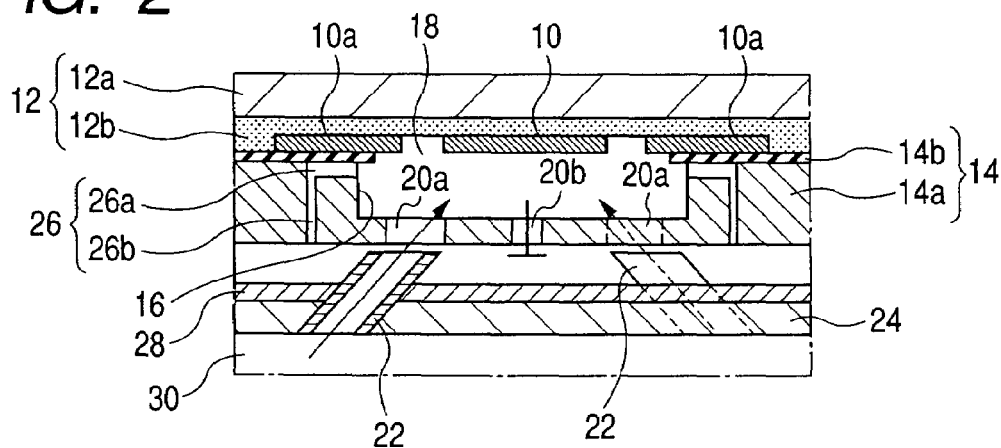
FIG. 2 is a partial sectional view explaining another example of the selective plating apparatus according to an embodiment of the invention.

In the selective plating apparatus shown in FIG. 1, one tilted injection nozzle 22 is provided. As shown in FIG. 2, a plurality of supply openings 20a for supplying the electrolytic plating solution into the space 18 and the discharge opening 20b for discharging the electrolytic plating solution from the space 18 are formed in the bottom portion of the recess portion 16 in the mask plate 14a, and the tilted injection nozzle 22 is provided in vicinity of the inlet side of the supply openings 20a respectively. The tilted injection nozzles 22 opened in vicinity of the supply openings 20a are provided such that the injection direction of the electrolytic plating solution is tilted mutually in different directions.

In the selective plating apparatus shown in FIG. 2, the electrolytic plating solution injected into the space 18 from the tilted injection nozzles 22 is fed in the different directions mutually. As a result, a swirling flow that is stronger than that generated in the selective plating apparatus shown in FIG. 1, to which one tilted injection nozzle 22 is provided, is generated in the space 18 in the selective plating apparatus shown in FIG. 2.

Figure 8:
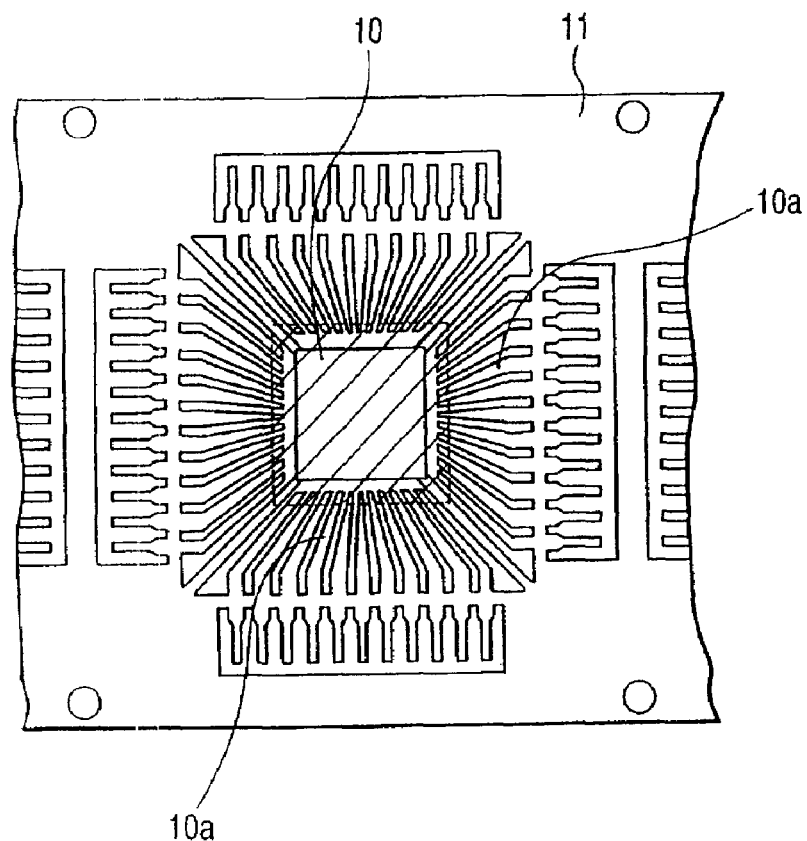
FIG. 8 is a front view explaining an example in which the selective plating is applied to the lead frame.

In the selective plating apparatus shown in FIG. 1 and FIG. 2, as shown in FIG. 8, the plated metal layer is formed on the overall surface of the stage 10 and the tip end portions of respective leads 10a on the stage 10 side.

Figure 3:
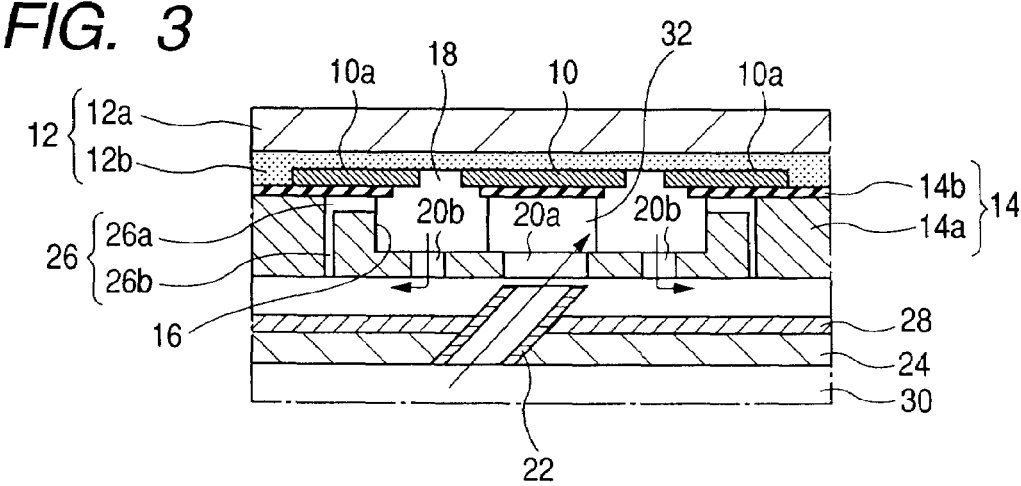
FIG. 3 is a partial sectional view explaining still another example of the selective plating apparatus according to an embodiment of the invention.
Figure 10:
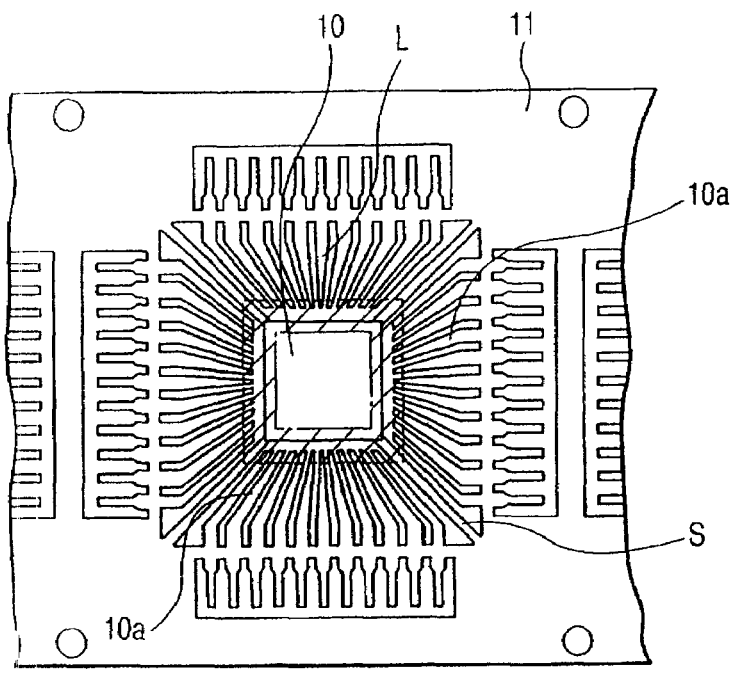
FIG. 10 is a front view explaining an example in which the selective plating is applied to the lead frame.

In contrast, as shown in FIG. 10, as the selective plating apparatus used to form the plated metal layer on the surface of the peripheral portion of the stage 10 and surfaces of the tip end portions of respective leads 10a on the stage 10 side, a selective plating apparatus shown in FIG. 3 can be employed.

In the selective plating apparatus shown in FIG. 3, the same reference symbols are affixed to the same portions as those of the selective plating apparatus shown in FIG. 1 and FIG. 2 and their detailed explanation will be omitted herein.

In the selective plating apparatus shown in FIG. 3, a column portion 32 a top end surface of which comes into contact with the surface of the stage 10 is formed on the mask plate 14a such that the plated metal is not deposited on the surface of the stage 10 except the surface of the peripheral portion. The rubber plate 14b is also provided to the top end surface of this column portion 32.

In the selective plating apparatus shown in FIG. 3, the annular space 18 surrounding the column portion 32 is formed by the column portion 32 which is formed on the mask plate 14a and whose top end surface comes in touch with the surface of the stage 10. The supply opening 20a for supplying the electrolytic plating solution into the space 18, and the discharge openings 20b for discharging the electrolytic plating solution from the space 18 are formed in the bottom portion of the recess portion 16 of the mask plate 14a constituting such annular space 18.

The injection nozzle 22 is provided in vicinity of the inlet of the supply opening 20a, and the injection nozzle 22 is tilted with respect to the nozzle plate 24. The electrolytic plating solution is injected from such injection nozzle 22 provided to be tilted (sometimes referred to as the "tilted injection nozzle 22" hereinafter) to the exposed parts of the surface of the lead frame (the surface of the peripheral portion of the stage 10 and surfaces of the tip end portions of respective leads 10a on the stage 10 side) exposed in the annular space 18 in the oblique direction.

In the selective plating apparatus shown in FIG. 3, when the anode plate 28 is connected to the anode of the power supply and also the lead frame is connected to the cathode of the power supply and then the electrolytic plating solution is injected into the annular space 18 from the tilted injection nozzle 22 via the supply opening 20a in the mask plate 14a, the plated metal layer is formed on the exposed parts of the surface of the lead frame (the surface of the peripheral portion of the stage 10 and surfaces of the tip end portions of respective leads 10a on the stage 10 side) exposed in the annular space 18, while discharging air in the annular space 18 to the outside of the annular space 18 via the air vent holes 26.

At that time, the electrolytic plating solution in the space 18 is discharged from the discharge openings 20b and returned to the liquid cell 30 while the electrolytic plating solution is being injected in the oblique direction to the surface of the peripheral portion of the stage 10 and the surfaces of the tip end portions of respective leads 10a on the stage 10 side exposed in the space 18 from the tilted injection nozzle 22 via the supply opening 20a.

In this manner, since the electrolytic plating solution is injected into the annular space 18 in the oblique direction to the exposed parts of the surface of the lead frame, a swirling flow of the electrolytic plating solution is generated in the annular space 18 to swirl around the column portion 32. Accordingly, a stagnation part in which the electrolytic plating solution stagnates in the space 18 with respect to the exposed parts of the surface of the lead frame exposed into the annular space 18 can be eliminated, and also a flow rate of the electrolytic plating solution with respect to the exposed parts of the surface of the lead frame can be enhanced. As a result, unevenness in thickness of the plated metal layer formed on the exposed parts of the surface of the lead frame, which is caused due to stagnation of the electrolytic plating solution, can be reduced as much as possible.

Figure 4:
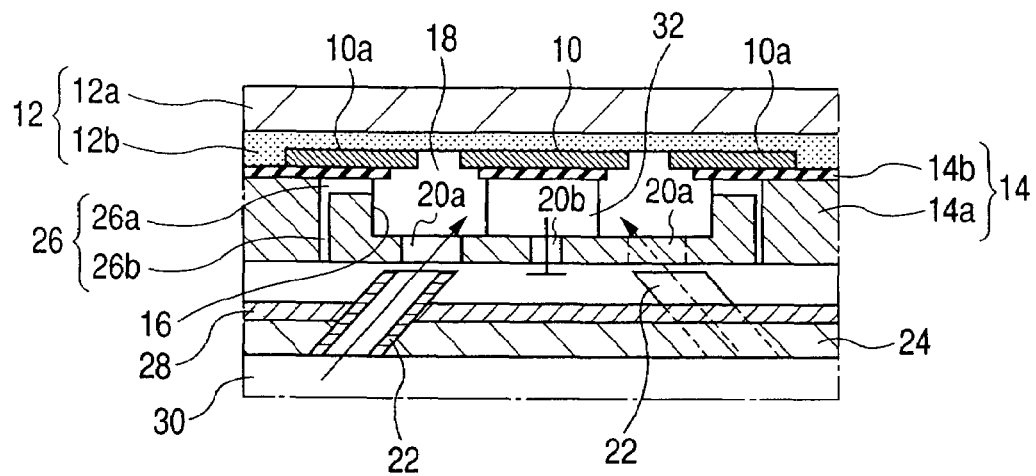
FIG. 4 is a partial sectional view explaining yet still another example of the selective plating apparatus according an embodiment of the invention.

In the selective plating apparatus shown in FIG. 3, one tilted injection nozzle 22 is provided. As shown in FIG. 4, a plurality of supply openings 20a for supplying the electrolytic plating solution into the annular space 18 and the discharge opening 20b for discharging the electrolytic plating solution from the annular space 18 are formed in the bottom portion of the recess portion 16 in the mask plate 14a, and the tilted injection nozzle 22 is provided in vicinity of the inlet side of the supply openings 20a respectively. The tilted injection nozzles 22 opened in vicinity of the supply openings 20a are provided such that the injection direction of the electrolytic plating solution is tilted mutually in different directions.

In the selective plating apparatus shown in FIG. 2, the electrolytic plating solution injected into the space 18 from the tilted injection nozzles 22 is fed in the different directions mutually. As a result, a swirling flow that is stronger than that generated in the selective plating apparatus shown in FIG. 3, to which one tilted injection nozzle 22 is provided, is generated in the annular space 18 in the selective plating apparatus shown in FIG. 4.

Although not shown in FIGS. 1-4, preferably the discharge opening 20b is formed larger than the supply opening 20a. In this case, the electrolytic plating solution is easily discharged compared to the case where the discharge opening 20b is formed smaller than the supply opening 20a, thus the stagnation in the space 18 with respect to the exposed parts of the surface of the lead frame can be more effectively eliminated, and also a flow rate of the electrolytic plating solution with respect to the exposed parts of the surface of the lead frame can be more effectively enhanced.

Example 1

A silver plating was applied to the surface of the peripheral portion of the stage 10 of the lead frame and the surfaces of the tip end portions of respective leads 10a on the stage 10 side shown in FIG. 10, by using the selective plating apparatus shown in FIG. 4. The tilted injection nozzles 22 were provided to this selective plating apparatus in vicinity of the inlet side of the supply openings 20a such that the electrolytic plating solution is injected to the surface of the peripheral portion of the stage 10 and the surfaces of the tip end portions of respective leads 10a on the stage 10 side, which are exposed into the annular space 18, via four supply openings 20a in the oblique direction. Such four tilted injection nozzles 22 were tilted at a tilt angle of 45° respectively such that their injection directions are set different mutually.

Also, as a comparative example, a silver plating was applied to the surface of the peripheral portion of the stage 10 of the lead frame and the surfaces of the tip end portions of respective leads 10a on the stage 10 side shown in FIG. 10, by using the selective plating apparatus shown in FIG. 12. In this selective plating apparatus, the injection nozzles 112 were provided perpendicularly in vicinity of the inlet side of the supply openings 104 such that the electrolytic plating solution is injected perpendicularly to the surface of the peripheral portion of the stage 10 and the surfaces of the tip end portions of respective leads 10a on the stage 10 side, which are exposed into the annular space 110, via four supply openings 104.

The lead frames in Example 1 and the comparative example were plated with silver under the electrolytic plating conditions given in Table 1, while using the commercially available silver plating solution as the electrolytic plating solution.

TABLE 1

| Bath temperature | pH | current density | anode plate 28(112) | current waveform |
| --- | --- | --- | --- | --- |
| 70° C. | 9.0 | 30 to 200 A/dm$^2$ | SUS plate | single-phase full-wave |

In Example 1, the silver plating solution was fed from the tilted injection nozzles 22 and then injected into the annular space 18 via the supply openings 20a formed in the mask plate 14a. The injection direction is the oblique direction to the exposed parts of the surface of the lead frame exposed to the annular space 18.

In contrast, in the comparative example, the silver plating solution was fed from the injection nozzles 112 and then injected into the annular space 110 via the supply openings 104 formed in the mask member 102. The injection direction is perpendicular to the exposed parts of the surface of the lead frame exposed to the annular space 110.

In Example 1 and the comparative example, in the lead frame shown in FIG. 10, thickness of the silver plated layer formed on tip end portions of both leads sandwiching a center lead L formed at a center portion of each side, and on tip end portions of both leads sandwiching a support bar S used to suspend the stage 10, were respectively measured. Results are shown in FIG. 5.

In addition, a thickness of the silver plated layer formed on the peripheral portion of the stage 10 located in vicinity of the tip end portion of the lead, a thickness of the silver plating on which was measured, was measured. Results are also shown in FIG. 5.

Figure 5:
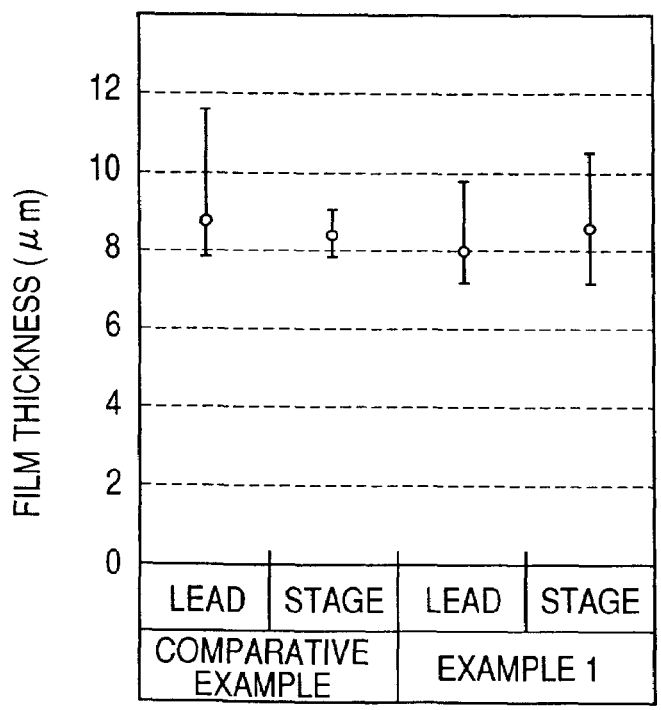
FIG. 5 is a graph showing unevenness in thickness of a plated metal layer at a tip end portion of a lead of a lead frame and at a peripheral portion of a stage to which selective plating is applied by using the selective plating apparatus according an embodiment of the invention.

In FIG. 5, the maximum value, the minimum value, and the average value of a thickness of the silver plated layer formed on the tip end portions of the leads are shown, and the maximum value, the minimum value, and the average value of a thickness of the silver plated layer formed the peripheral portion of the stage 10 are shown. As apparent from FIG. 5, in Example 1, unevenness in thickness of the silver plated layer between the lead and the stage was suppressed to the almost same extent. However, in the comparative example, unevenness in thickness of the silver plated layer on the leads was large rather than unevenness in thickness of the silver plated layer on the stage, and unevenness in thickness of the silver plated layer between both portions was large rather than Example 1.

Example 2

In Example 2, the silver plating was applied to the tip end portions of the leads of the lead frame and the peripheral portion of the stage in the same manner as Example 1 except that a quantity of charge applied to the lead frame is changed by changing an electrolytic plating time while an amount of current is kept constant.

A film thickness of the silver plated layer formed on the tip end portions of the leads of the lead frame and the peripheral portions of the stage, to which the silver plating was applied, was measured. Results are shown in FIG. 6 and FIG. 7.

Figure 6:
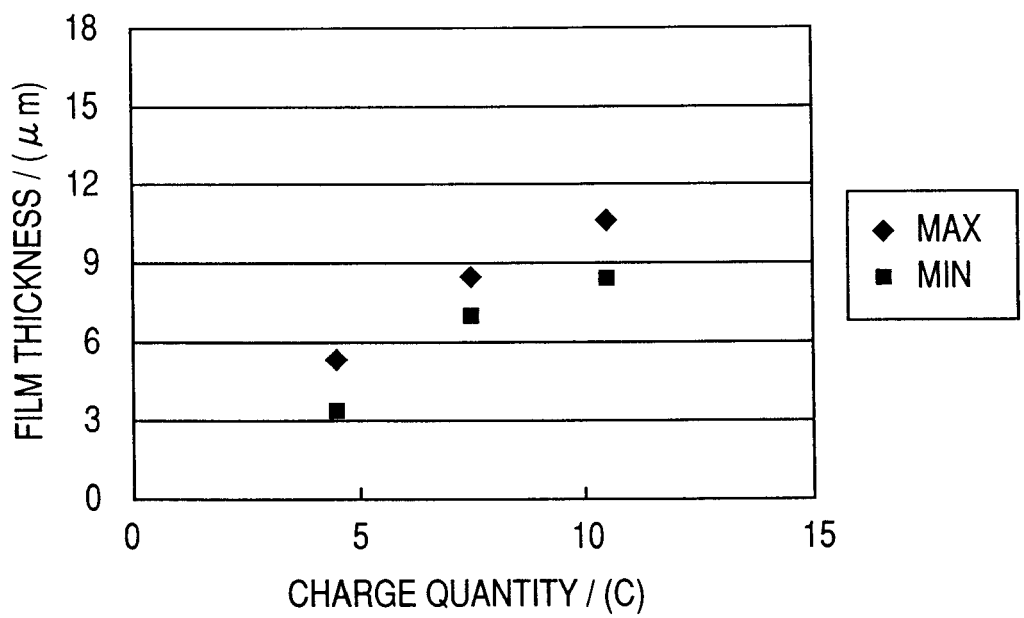
FIG. 6 is a graph showing a relationship between unevenness in thickness of a plated metal layer formed on the lead frame to which the selective plating is applied by using the selective plating apparatus according an embodiment of the invention, and a quantity of charge.

FIG. 6 shows changes of the maximum value and the minimum value of a thickness of the silver plated layer formed on the tip end portions of the leads of the lead frame and the peripheral portion of the stage by using the selective plating apparatus in Example 2 with respect to a quantity of charge. Unevenness in thickness of the silver plated layer is kept almost constant even when a quantity of charge is increased (the silver plated layer is made thick).

Figure 7:
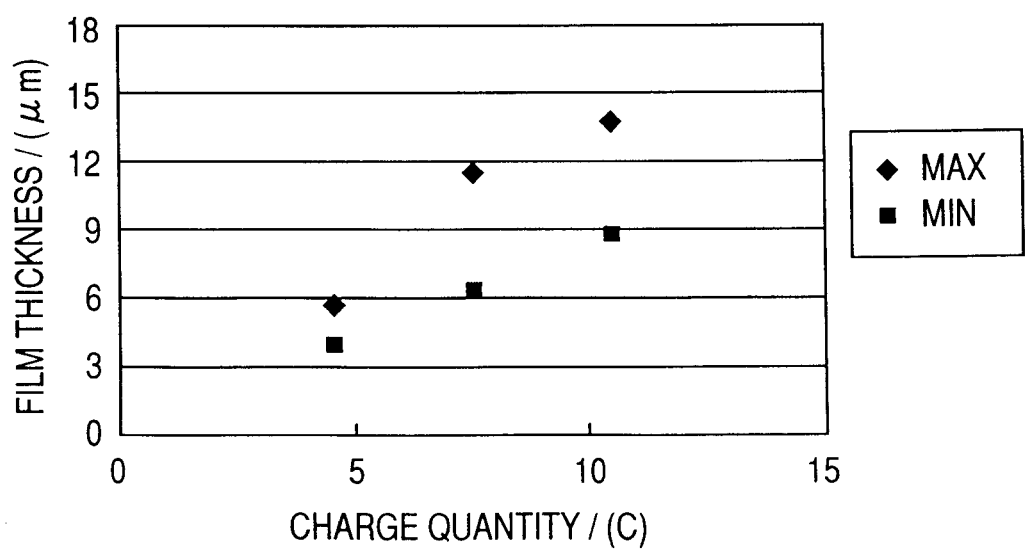
FIG. 7 is a graph showing a relationship between unevenness in thickness of a plated metal layer formed on the lead frame to which the selective plating is applied by using a selective plating apparatus of the related art, and a quantity of charge.

In contrast, FIG. 7 shows changes of the maximum value and the minimum value of a thickness of the silver plated layer formed on the tip end portions of the leads of the lead frame and the peripheral portion of the stage by using the selective plating apparatus in the comparative example with respect to a quantity of charge. Unevenness in thickness of the silver plated layer is increased as a quantity of charge is increased (the silver plated layer is made thick).

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A selective plating apparatus for applying selective electrolytic plating to a metal member, the selective plating apparatus comprising:

a mask member having a recess portion so that a space is formed to which predetermined parts of a surface of the metal member are exposed when the mask member is attached to the metal member, and having at least one supply opening for supplying electrolytic plating solution into the space and a discharge opening for discharging the electrolytic plating solution from the space, the supply opening and the discharge opening both formed in a bottom portion of the recess portion; and a plurality of injection nozzles which inject the electrolytic plating solution into the space in different directions with respect to the predetermined parts of the surface of the metal member, and are arranged in vicinity of the supply opening to generate a swirling flow of the electrolytic plating solution injected into the space, wherein the plurality of injection nozzles are provided to be tilted with respect to the surface of the metal member.

2. The selective plating apparatus according to claim 1, wherein the metal member is a lead frame.

3. The selective plating apparatus according to claim 1, wherein said at least one supply opening includes a plurality of supply openings, and said plurality of injection nozzles respectively corresponding to the supply openings.

4. The selective plating apparatus according to claim 1, wherein the metal member is a lead frame on which a periphery portion of a stage for mounting a semiconductor element is surrounded by a plurality of tip end portions of leads, and the mask member covers the surface of the lead frame except a surface of the peripheral portion of the stage and surfaces of the tip end portions of the leads.

5. The selective plating apparatus according to claim 1, wherein the discharge opening is formed larger than the supply opening.

6. A selective plating method for applying selective electrolytic plating to a metal member, the selective plating apparatus comprising:

attaching a mask member to the metal member, the mask member having a recess portion so that a space is formed to which predetermined parts of a surface of the metal member are exposed when the mask member is attached to the metal member, and having at least one supply opening for supplying electrolytic plating solution into the space and a discharge opening for discharging the electrolytic plating solution from the space, the supply opening and the discharge opening both formed in a bottom portion of the recess portion;

injecting electrolytic plating solution into the space in different directions with respect to the predetermined parts of the surface of the metal member by a plurality of injection nozzles which are arranged in vicinity of the supply opening to generate a swirling flow of the electrolytic plating solution injected into the space.

7. The selective plating method according to claim 6, wherein a lead frame is used as the metal member.

8. The selective plating method according to claim 6, wherein said at least one supply opening includes a plurality of supply openings, and said plurality of injection nozzles respectively corresponding to the supply openings.

9. The selective plating method according to claim 6, wherein a lead frame on which a periphery portion of a stage for mounting a semiconductor element is surrounded by a plurality of tip end portions of leads is used as the metal member, and the mask member which covers the surface of the lead frame except a surface of the peripheral portion of the stage and surfaces of the tip end portions of the leads is used.

10. The selective plating method according to claim 6, wherein the discharge opening is formed larger than the supply opening.

* * * * *